(12) United States Patent
Ichikawa et al.

(10) Patent No.: US 11,349,233 B2
(45) Date of Patent: May 31, 2022

(54) CONNECTION STRUCTURE INCLUDING CIRCUIT BODY AND CONDUCTIVE BODY

(71) Applicant: Yazaki Corporation, Tokyo (JP)

(72) Inventors: Yoshiaki Ichikawa, Makinohara (JP); Tatsuya Oga, Makinohara (JP); Mariko Nakagawa, Makinohara (JP); Tomoji Yasuda, Makinohara (JP)

(73) Assignee: Yazaki Corporation, Tokyo (JP)

(*) Notice: Subject to any disclaimer, the term of this patent is extended or adjusted under 35 U.S.C. 154(b) by 0 days.

(21) Appl. No.: 17/097,363

(22) Filed: Nov. 13, 2020

(65) Prior Publication Data

US 2021/0151915 A1 May 20, 2021

(30) Foreign Application Priority Data

Nov. 15, 2019 (JP) .............................. JP2019-207268

(51) Int. Cl.
*H05K 1/00* (2006.01)
*H01R 12/65* (2011.01)
*H05K 1/18* (2006.01)

(52) U.S. Cl.
CPC ............. *H01R 12/65* (2013.01); *H05K 1/189* (2013.01); *H05K 1/181* (2013.01); *H05K 2201/10272* (2013.01); *H05K 2201/2009* (2013.01)

(58) Field of Classification Search
CPC ........ H01R 12/65; H05K 1/189; H05K 1/181; H05K 2201/10272; H05K 2201/2009; H05K 3/3405; H05K 2201/10181; H05K 3/284
See application file for complete search history.

(56) References Cited

U.S. PATENT DOCUMENTS

| 6,175,086 | B1* | 1/2001 | Nakamura | H05K 3/3485 |
| | | | | 29/843 |
| 8,944,310 | B2* | 2/2015 | Matsushita | H01L 23/3735 |
| | | | | 228/246 |
| 9,418,919 | B2* | 8/2016 | Groenhuis | H01L 23/49548 |
| 10,286,473 | B2* | 5/2019 | Reul | H05B 3/84 |
| 10,856,367 | B2* | 12/2020 | Lyon | B23K 1/0016 |

(Continued)

FOREIGN PATENT DOCUMENTS

| JP | 2002-093995 A | 3/2002 |
| JP | 2010-165812 A | 7/2010 |
| JP | 2015-065468 A | 4/2015 |

*Primary Examiner* — Pete T Lee

(74) *Attorney, Agent, or Firm* — Banner & Witcoff, Ltd.

(57) ABSTRACT

A connection structure includes: a circuit body including a flexible printed circuit having a wiring pattern; and a conductive body connected to a mounting surface of the circuit body using a solder. The conductive body has a pair of connection portions opposed to each other and extending along the mounting surface. The solder forms solder fillets located around the pair of connection portions and extending along the mounting surface. A first fillet width of one solder fillet among the solder fillets located in an inside region between the pair of connection portions is larger than a second fillet width of another solder among the solder fillets located in an outside region of one of the pair of connection portions, which is on a side opposite to the inside region across the one of the pair of connection portions.

2 Claims, 5 Drawing Sheets

(56) References Cited

U.S. PATENT DOCUMENTS

| | | | |
|---|---|---|---|
| 2002/0038723 A1* | 4/2002 | Takeda | H05K 3/3405 |
| | | | 174/260 |
| 2006/0068620 A1* | 3/2006 | Okamura | H01R 12/716 |
| | | | 439/79 |
| 2008/0099906 A1* | 5/2008 | Yamasaki | H01L 23/49551 |
| | | | 257/691 |
| 2014/0182932 A1* | 7/2014 | Cholewa | H05B 3/84 |
| | | | 174/84 R |
| 2015/0236438 A1* | 8/2015 | Rateiczak | B23K 1/0016 |
| | | | 439/884 |
| 2019/0044197 A1* | 2/2019 | Ota | H01M 10/425 |

\* cited by examiner

CONNECTION STRUCTURE INCLUDING CIRCUIT BODY AND CONDUCTIVE BODY

CROSS-REFERENCE TO RELATED APPLICATIONS

This application is based on and claims priority under 35 USC 119 from Japanese Patent Application No. 2019-207268 filed on Nov. 15, 2019, the contents of which are incorporated herein by reference.

TECHNICAL FIELD

The present invention relates to a connection structure comprising: a circuit body including a flexible printed circuit (FPC) having a wiring pattern; and a conductive body connected to a mounting surface of the circuit body using a solder.

BACKGROUND ART

Recently, FPCs which are formed with a wiring pattern are used as, for example, wiring means for connecting various electronic devices. FPCs have, in general, a structure that thin-film conductive layers constituting a wiring pattern (i.e., circuit) having a prescribed shape is sandwiched between insulative films and, in particular, has a feature that they can be deformed (e.g., warped) flexibly while their electrical characteristics are maintained.

As for details of the above FPC, refer to JP 2002-093995 A.

Incidentally, to connect a conductive body such as a busbar directly to a circuit pattern of an FPC, solder may be used because this method provides high joining strength and enables self-fitting at the time of joining. The self-fitting is a phenomenon that, in general, when a joining target object is placed on molten solder the joining target object naturally settles approximately at the center of the molten solder due to surface tension etc. of the molten solder.

Because of the above principle, when a conductive body is connected to a circuit pattern utilizing the self-fitting, a solder fillet (i.e., a peripheral spread portion that is formed when solder spreads wetting the circuit pattern) is formed so as to expand away from the conductive body staying at the center. In view of this, the circuit pattern is designed so that its width is long enough to accept such a fillet. As a result, the solder joining may become an obstacle to thinning of a circuit pattern. From the viewpoint of, for example, minimization of a circuit structure using an FPC, it is desirable to realize a connection structure of a circuit body and a conductive body that enables further thinning of a circuit pattern.

SUMMARY OF INVENTION

Aspect of non-limiting embodiments of the present disclosure relates to providing a connection structure of circuit body and conductive body capable of thinning a circuit pattern.

Aspects of certain non-limiting embodiments of the present disclosure address the features discussed above and/or other features not described above. However, aspects of the non-limiting embodiments are not required to address the above features, and aspects of the non-limiting embodiments of the present disclosure may not address features described above.

According to an aspect of the present disclosure, there is provided a connection structure comprising:

a circuit body including a flexible printed circuit having a wiring pattern; and a conductive body connected to a mounting surface of the circuit body using a solder, the conductive body having a pair of connection portions opposed to each other and extending along the mounting surface, the solder comprising solder fillets located around the pair of the connection portions and extending along the mounting surface, a first fillet width of one solder fillet among the solder fillets located in an inside region between the pair of the connection portions being larger than a second fillet width of another one solder among the solder fillets located in an outside region on an opposite side to the inside region across the connection portions.

BRIEF DESCRIPTION OF DRAWINGS

Exemplary embodiment(s) of the present invention will be described in detail based on the following figures, wherein.

DESCRIPTION OF EMBODIMENTS

Figure 1:
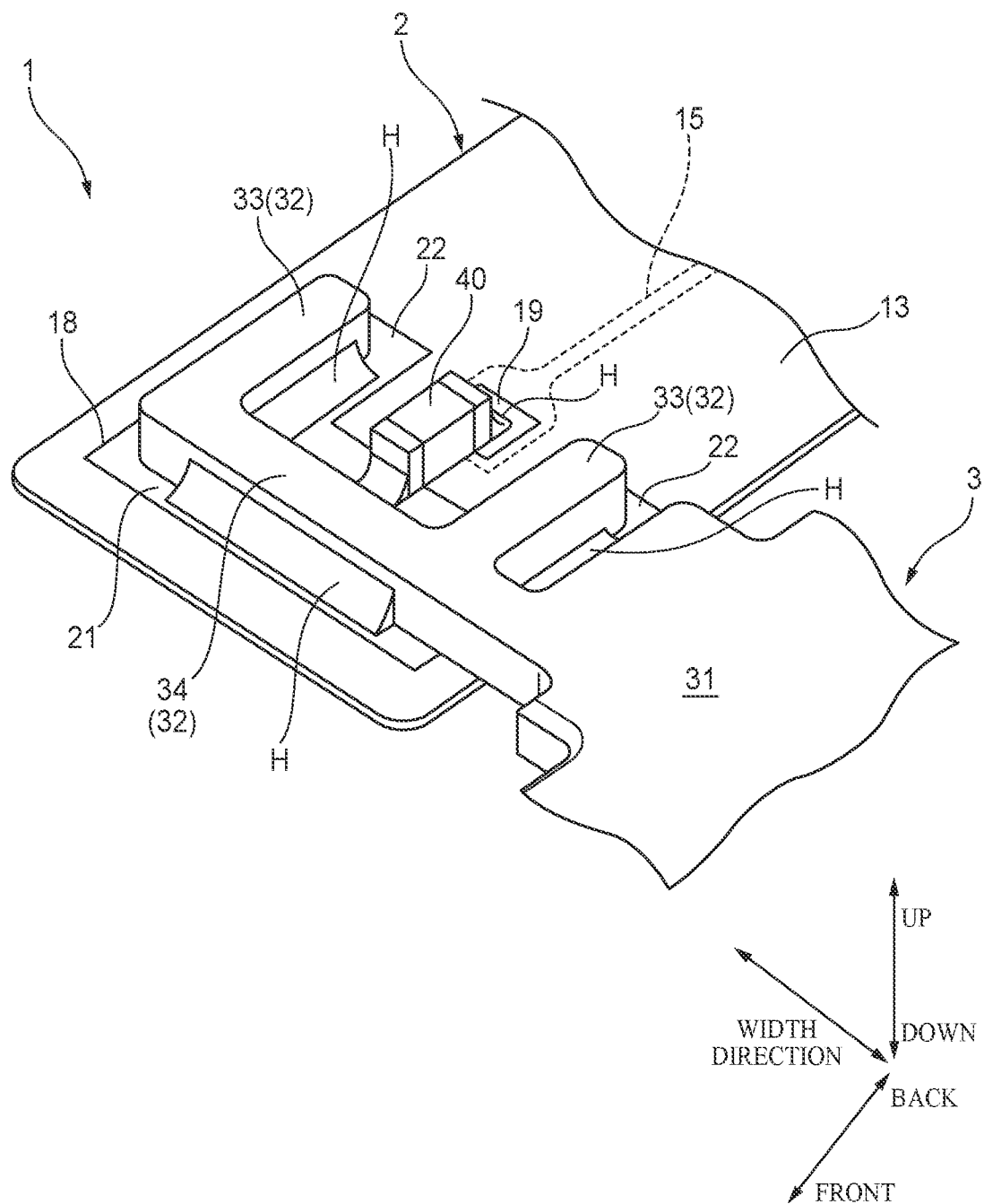
FIG. 1 is a perspective view of a connection structure of a circuit body and a conductive body according to an exemplary embodiment of the present invention.

A connection structure 1 of a circuit body 2 and a conductive body 3 according to an embodiment of the present invention will be hereinafter described with reference to the drawings. For the sake of convenience of description, the front-rear direction, the width direction, the top-bottom direction, the front side, the rear side, the top side, and the bottom side are defined as shown in FIG. 1 etc. The front-rear direction, the width direction, and the top-bottom direction are perpendicular to each other. The front-rear direction and the width direction coincide with the extension direction and the width direction of the circuit body 2 that extends like a band, respectively.

Figure 2:
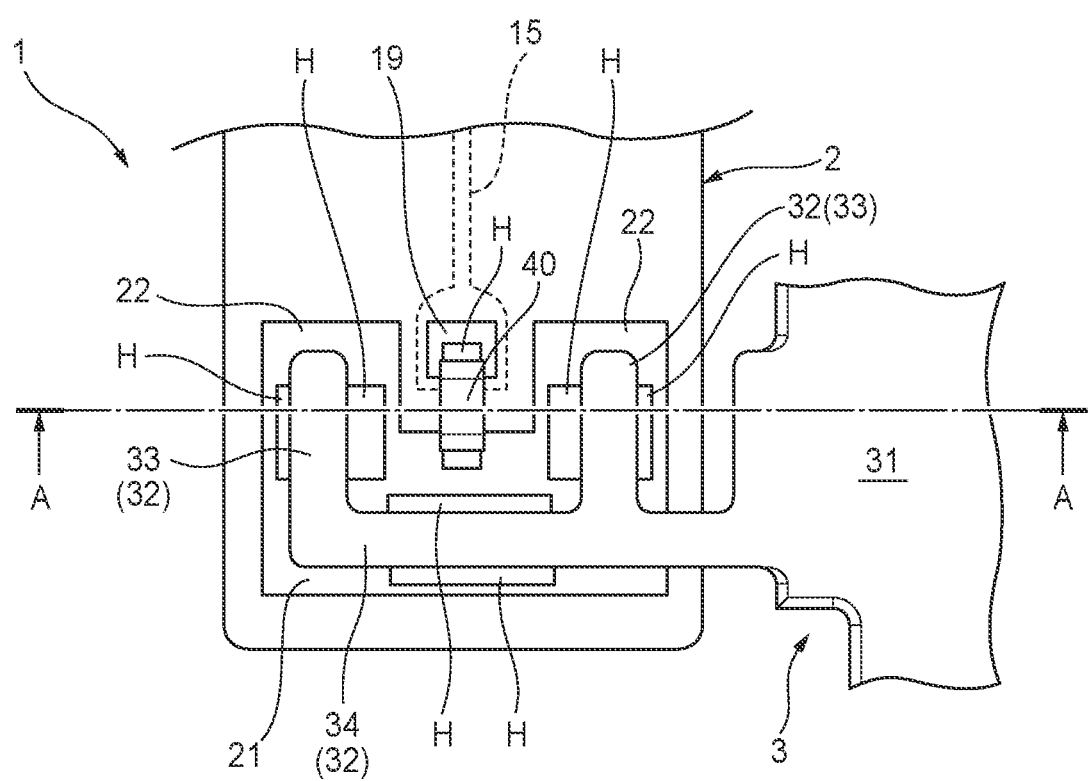
FIG. 2 is a top view of a connection region shown in FIG. 1.

As shown in FIGS. 1 and 2, the connection structure 1 is provided with the circuit body 2 which is flexible printed circuits (FPC) having a wiring pattern and the conductive body 3 having a pair of flat-plate-shaped connection portions 33 and attached to an opening portion 18 of an insulating layer 13 of the circuit body 2. For example, the connection structure 1 is used on a path that connects a battery assembly (a battery module in which plural cells are stacked) to serve as a drive battery installed in an electric vehicle, a hybrid vehicle, or the like and any of various control devices (ECU etc.). The structures of individual components of the connection structure 1 will be described one by one.

Figure 3A:
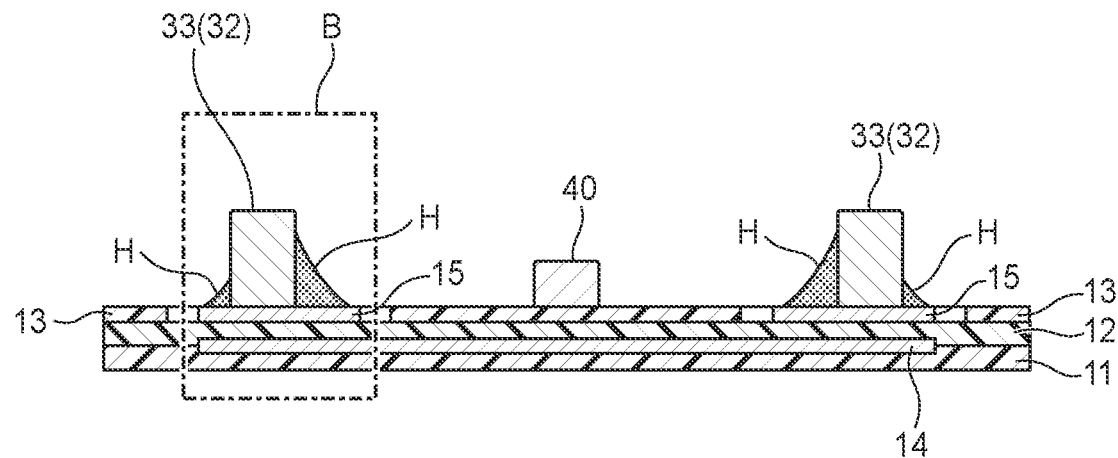
FIG. 3A is an A-A sectional view of FIG. 2.

First, the circuit body 2 will be described. The circuit body 2 is an FPC that extends like a band. More specifically, as shown in FIG. 3A, the circuit body 2 has three thin-film insulating layers consisting of a first insulating layer 11, a second insulating layer 12 formed on the first insulating layer 11, and a third insulating layer 13 formed on the second insulating layer 12. A thin-film lower conductive layer 14 is sandwiched between the first insulating layer 11 and the second insulating layer 12 and a thin-film upper conductive layer 15 is formed in the third insulating layer 13. In this example, the lower conductive layer 14 and the upper conductive layer 15 constitute a "wiring pattern" which is a term used in the claims. Typically, the first to third insulating layers 11-13 are made of polyimide and the lower conductive layer 14 and the upper conductive layer 15 are made of copper.

A resin adhesive layer (not shown) is sandwiched between the first insulating layer 11 and the second insulating layer 12 in a region where the lower conductive layer 14 is not formed, and another resin adhesive layer is sandwiched between the second insulating layer 12 and the third insulating layer 13 in a region where the upper conductive layer 15 is not formed. In this manner, the circuit body 2 has a lamination structure in which the two conductive layers 14 and 15 are buried between (or in) the three insulating layers 11-13.

As shown in FIGS. 1 and 2, two openings 18 are formed (exposed) in the top surface of a front end portion of the circuit body 2 as a result of removal of portions of the third insulating layer 13 and portions, adjoining the removed portions of the third insulating layer 13 from below, of the adhesive layer 16. A rectangular first conductive portion 19 is formed in one of the two openings 18 as a portion of the upper conductive layer 15.

Furthermore, a band-shaped (rectangular) second conductive portion 21 that extends to both sides in the width direction from a position that is spaced from the first conductive portion 19 by a prescribed distance and a pair of band-shaped (rectangular) third conductive portions 22 that extend in the front-rear direction from the two ends, in the width direction, of the second conductive portion 21, respectively, are formed inside the other opening 18 as portions of the upper conductive layer 15. The pair of third conductive portions 22 are spaced from the first conductive portion 19 in the width direction by a prescribed distance. That is, a U-shaped conductive portion that is composed of the second conductive portion 21 and the pair of third conductive portions 22 is formed so as to be spaced from the first conductive portion 19 by prescribed distances and to surround it from three directions. As described later, the first conductive portion 19 and the second conductive portion 21 are electrically connected to each other by a chip fuse 40. The description of the circuit body 2 completes here.

Next, the conductive body 3 will be described. As shown in FIGS. 1 and 2, in this example, the conductive body 3 is a busbar that is rectangular in cross section and is composed of a main body portion 31 that extends straightly in the width direction and an approximately U-shaped frame portion 32 that is continuous with one end of the main body portion 31.

Among the three legs constituting the frame portion 32, the two legs that are opposed to each other in the width direction and extend in the front-rear direction are particularly referred to as "connection portions 33. When viewed from above, each connection portion 33 is shaped like a band (rectangle) that is uniform in width (i.e., the dimension in the width direction). It can also be said that each connection portion 33 is shaped like a flat plate that extends in the front-rear direction and the top-bottom direction. The pair of connection portions 33 are connected to each other by a link portion 34 which extends in the width direction. The width of each connection portion 33 is shorter than the width of each of the third conductive portions 22. The conductive body 3 is typically made of copper or aluminum. The description of the conductive body 3 completes here.

Next, a description will be made of how the circuit body 2 and the conductive body 3 are attached to each other to obtain the connection structure 1 shown in FIGS. 1 and 2. First, pieces of solder paste that accommodate reflow-type soldering are placed on the third conductive portions 22. At this time, the position and the amount of each piece of solder paste are determined so that the amount of solder paste located in an inside region between the pair of connection portions 33 is larger than the amount of solder paste located in a region outside the associated connection portion 33.

Then the frame portion 32 is pushed down toward the opening 18 of the circuit body 2 so that the connection portions 33 come into contact with the top surfaces of the corresponding third conductive portions 22. At this time, the frame portion 32 is positioned in a state that as described above the amount of each piece of solder paste located in the inside region between the pair of connection portions 33 is larger than the amount of solder paste located in region outside the associated connection portion 33. The pieces of solder paste are thereafter heated via the conductive body 3 by, for example, increasing the temperature of a heater that is incorporated in a pressor for pressing the frame portion 32. After the solder paste is melted by this heating, the heating is stopped to solidify the molten solder. The joining of the connection portions 33 and the respective third conductive portions 22 is thus completed.

Figure 3B:
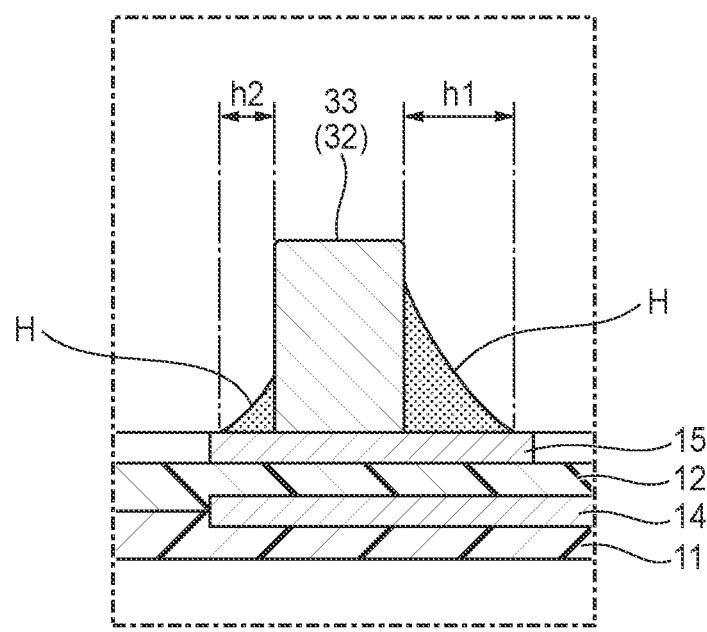
FIG. 3B is an enlarged view of part B of FIG. 3A.

In this state, as shown in FIGS. 3A and 3B, the fillet width h1 of the solder H located in the inside region adjacent to each connection portion 33 is larger than the fillet width h2 of the solder H located in the outside region adjacent to the connection portion 33. There are no particular limitations on the ratio between the fillet widths h1 and h2 except that the fillet width h1 should be larger than the fillet width h2 (i.e., h1>h2). For example, the ratio may be determined as appropriate taking into consideration the areas of the inside regions and the outside regions of the conductive body 3, the strength of joining of the conductive body 3 to the circuit body 2, the magnitude of a contact resistance value, and other factors.

Incidentally, when pieces of solder paste are melted by heating, force of moving each connection portion 33 to a central portion of the corresponding molten solder usually acts on the connection portion 33 because of the self-setting effect of the molten solder. However, since as described above larger solder paste is set in the inside region than in the outside region and the pair of connection portions 33 are connected to each other by the link portion 34, forces produced by the pieces of solder paste by the self-setting effect in such directions as to move the pair of connection portions 33 outward (i.e., separate the pair of connection portions 33 from each other) balance each other. As a result, as shown in FIG. 3B, solidified pieces of solder H are formed on the two respective sides of each connection portion 33 with different fillet widths h1 and h2.

Subsequently, a chip fuse 40 is set so as to bridge the first conductive portion 19 and the second conductive portion 21 and is bonded and fixed to each of the first conductive portion 19 and the second conductive portion 21 by the same soldering as described above. As a result, one of electrodes formed at two respective end portions of the chip fuse 40 is bonded and electrically connected to the first conductive portion 19 and the electrode formed at the other end portion of the chip fuse 40 is bonded and electrically connected to the second conductive portion 21. Thus, the connection structure 1 shown in FIGS. 1 and 2 is completed. In the connection structure 1, the first conductive portion 19 which is part of the upper conductive layer 15 of the circuit body 2 is electrically connected to the main body portion 31 of the conductive body 3 via the chip fuse 40, the second conductive portion 21, the third conductive portions 22, the connection portions 33, and the link portion 34.

As described above, in the connection structure 1 according to the embodiment, the circuit pattern (third conductive portions 22) and the conductive body 3 are joined to each other in such a manner that the fillet width h1 of the solder H located in the associated one, adjacent to each connection portion, of inside regions located between the pair of connection portions 33 of the conductive body 3 is larger than the fillet width h2 of the solder H located in the outside region located on the opposite side of the connection portion 33 to the associated inside region. According to this connection structure 1, the fillet width h2 of the solder H located in each outside region can be made smaller than in typical connection structures. As a result, the width of each outside region adjacent to the circuit pattern (each third conductive portion) can be made smaller than in typical connection structures without impairing the strength or conductivity provided by solder H. As such, the connection structure 1 can make the circuit pattern (third conductive portions 22) thinner than in typical connection structures.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

Figure 4A:
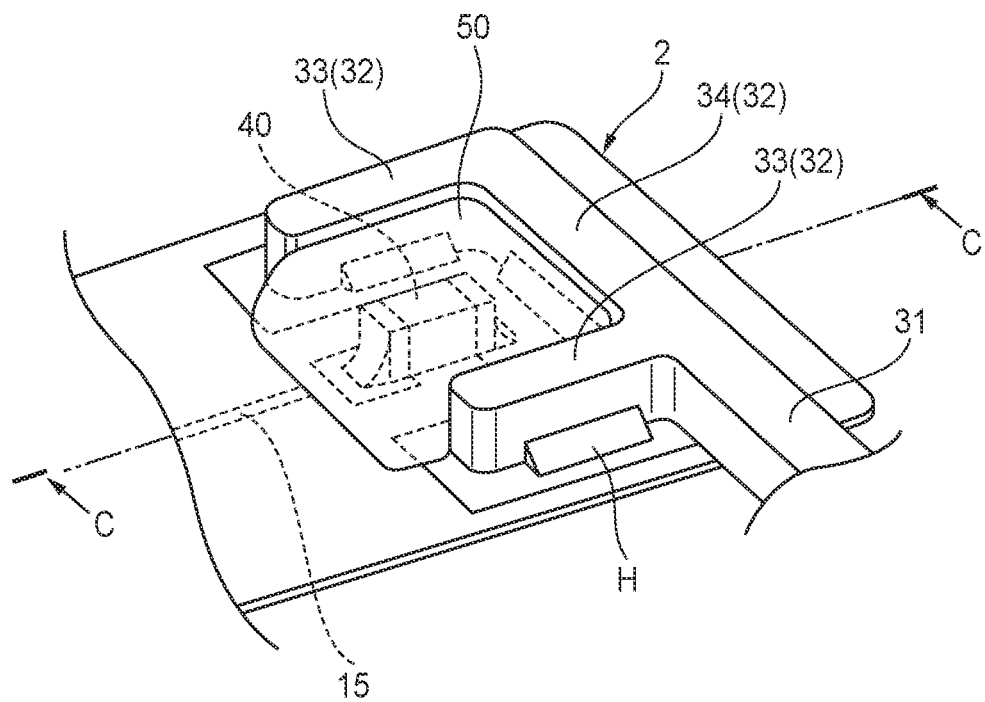
FIG. 4A is a perspective view of a connection structure of a circuit body and a conductive body according to an another exemplary embodiment of the present invention.
Figure 4B:
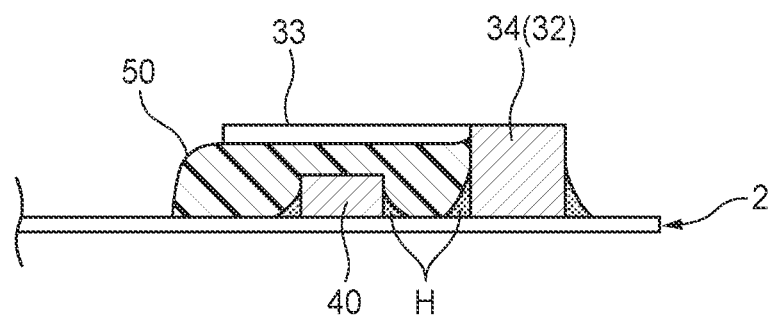
FIG. 4B is a C-C sectional view of FIG. 4A.

In the above embodiment, the chip fuse 40 is mounted on the circuit body 2 in such a state as to be exposed to the outside. For example, as shown in FIGS. 4A and 4B, a potting material 50 may be formed in an inside region defined by the frame portion 32 of the conductive body 3 so as to cover the chip fuse 40 to isolate it from the outside.

Covering the chip fuse 40 with the potting material 50 makes it possible to increase the waterproofness of the chip fuse 40 and the electrical contacts around it. Furthermore, since the potting material 50 solidifies so as to be in close contact with the surfaces of the circuit body 2, deformation of the circuit body 2 can be suppressed by the stiffness of the potting material 50. It is preferable that the potting material 50 be formed so as to fill up the entire inside region defined by the frame portion 32. Since the fillet widths h1 of the pieces of solder H provided in the respective inside regions are large, the capacity of the inside region defined by the frame portion 32 is decreased as much and hence the amount of the potting material 50 used can be reduced.

Figure 5:
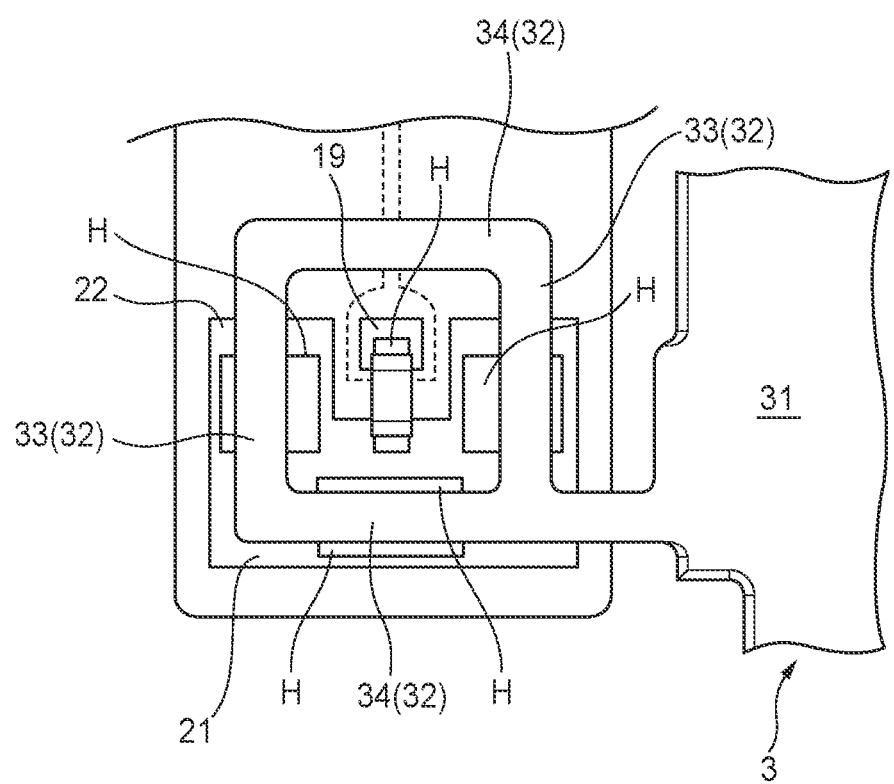
FIG. 5 is a top view corresponding to FIG. 2 of a still another exemplary embodiment of the present invention.

Furthermore, in the above embodiment, the frame portion 32 of the conductive body 3 is approximately U-shaped. Alternatively, as shown in FIG. 5, the conductive body 3 may be shaped like a rectangular ring. That is, it suffices that the pair of connection portions 33 be opposed to each other and connected to each other by the link portion(s) 34.

According to the above exemplary embodiment, a connection structure (1) comprises: a circuit body (2) including a flexible printed circuit having a wiring pattern; and a conductive body (3) connected to a mounting surface of the circuit body (2) using a solder (H).

The conductive body (3) has a pair of connection portions (33) opposed to each other and extending along the mounting surface.

The solder (H) comprises solder fillets located around the pair of the connection portions (33) and extending along the mounting surface. A first fillet width (h1) of one solder fillet among the solder fillets located in an inside region between the pair of the connection portions is larger than a second fillet width (h2) of another one solder among the solder fillets located in an outside region on an opposite side to the inside region across the connection portions (33).

In the connection structure having this configuration, the circuit pattern and the conductive body are joined to each other in such a manner that the fillet width of the solder located in the associated one, adjacent to each connection portion, of inside regions located between the pair of connection portions of the conductive body is larger than the fillet width of the solder located in the outside region located on the opposite side of the connection portion to the associated inside region. More specifically, when the circuit pattern and the conductive body are joined to each other, force of moving each connection portion to a central portion of the corresponding molten solder usually acts on the connection portion because of the self-setting effect of the molten solder. However, where the soldering is of a reflow-type, if larger solder paste is set in the inside region in advance than in the outside region, forces produced by the pieces of solder paste by the self-setting effect in such directions as to move the pair of connection portions outward (i.e., separate the pair of connection portions from each other) balance each other because the pair of connection portions are connected to each other as portions of the conductive body (e.g., by a link portion having a prescribed shape of the conductive body). When the molten solder cools in this state, the circuit pattern and the conductive body are joined to each other in a state that the fillet width of the solder located in each inside region is larger than the fillet width of the solder located in the corresponding outside region.

In the connection structure having this configuration, the fillet width of solder extending in each outside region can be made smaller without impairing the strength or conductivity of solder joining than in a case of simply decreasing the amount of solder. As a result, the width of each outside region of the circuit pattern can be made smaller than in typical connection structures. As such, the connection structure having this configuration can make the circuit pattern thinner than in typical connection structures.

Where a fillet of solder is formed so as to expand away from the side surface of each connection portion of the conductive body, the above-used term "fillet width" means a width of the fillet from the side surface and a position, farthest from the side surface, of the fillet. Where this width varies from one position to another in the fillet, an average of width values measured at respective positions in the fillet may be employed as the fillet width. Where the conductive body and the circuit pattern can be joined to each other with sufficient strength and a sufficiently low contact resistance merely by the pieces of solder located in the inside regions, the width of the fillet located in each outside region may be equal to zero (i.e., no solder fillet exists there).

The connection structure (1) may further comprise an electronic element (40) attached to the mounting surface to connect the conductive body (3) and the wiring pattern; and a sealing material (50) covering the electronic element (40)

to isolate the electronic element (40) from outside of the sealing material (50). The electronic element (40) and the sealing material (50) are located in the inside region.

In the connection structure having this configuration, the electronic element is mounted in the region located between the pair of connection portions of the conductive body. The waterproofness of the electronic element, the contacts between the electronic element and the conductive body, etc. can be increased by the sealing material (e.g., potting material) that covers the electronic element. Furthermore, after the sealing material solidifies being in close contact with the mounting surface, the sealing material suppresses a phenomenon that external force acts on the contacts between the electronic element and the conductive body. Furthermore, the larger fillet widths of the inside regions adjacent to the respective connection portions decrease the capacity of the region located between the connection portions, whereby the amount of the sealing material used can be reduced.

As such, the invention can provide a connection structure of circuit body and conductive body capable of thinning a circuit pattern.

What is claimed is:

1. A connection structure comprising:
    a circuit body including a flexible printed circuit having a wiring pattern; and
    a conductive body connected to a mounting surface of the circuit body using a solder and contacting the mounting surface of the circuit body,
    the conductive body having a pair of connection portions opposed to each other and extending along the mounting surface,
    the solder comprising solder fillets located around the pair of connection portions and extending along the mounting surface, a first fillet width of one solder fillet among the solder fillets located in an inside region between the pair of connection portions being larger than a second fillet width of another solder among the solder fillets located in an outside region of one of the pair of connection portions, which is on a side opposite to the inside region across the one of the pair of connection portions,
    the connection structure further comprising:
        an electronic element attached to the mounting surface to connect the conductive body and the wiring pattern; and
        a sealing material covering the electronic element to isolate the electronic element from outside of the sealing material, the sealing material being formed so as to fill up the inside region entirely, and the electronic element and the sealing material being located in the inside region.

2. The connection structure according to claim 1, wherein the conductive body includes a link portion which connects the pair of connection portions, the link portion connected to the mounting surface of the circuit body using the solder.

* * * * *